(12) United States Patent
Gingras

(10) Patent No.: US 12,170,212 B2
(45) Date of Patent: Dec. 17, 2024

(54) GIMBAL BONDING TOOL AND A METHOD TO CORRECT SURFACE NON-UNIFORMITIES USING A BONDING TOOL

(71) Applicant: VueReal Inc., Waterloo (CA)

(72) Inventor: Drew Robert Gingras, Waterloo (CA)

(73) Assignee: VueReal Inc., Waterloo (CA)

( * ) Notice: Subject to any disclaimer, the term of this patent is extended or adjusted under 35 U.S.C. 154(b) by 0 days.

(21) Appl. No.: 18/550,805

(22) PCT Filed: Mar. 16, 2022

(86) PCT No.: PCT/CA2022/050393
§ 371 (c)(1),
(2) Date: Sep. 15, 2023

(87) PCT Pub. No.: WO2022/193010
PCT Pub. Date: Sep. 22, 2022

(65) Prior Publication Data
US 2024/0162062 A1    May 16, 2024

Related U.S. Application Data

(60) Provisional application No. 63/161,714, filed on Mar. 16, 2021.

(51) Int. Cl.
*H01L 21/67* (2006.01)
*H05B 3/28* (2006.01)

(52) U.S. Cl.
CPC ........ *H01L 21/67092* (2013.01); *H05B 3/283* (2013.01)

(58) Field of Classification Search
CPC ..... H01L 21/67092; H01L 2224/75251; H01L 2224/75252; H01L 24/75; H01L 2221/68363; H01L 2224/75301; H01L 2224/75745; H01L 2224/75823; H01L 2224/7598; H01L 2924/3511; H01L 21/6835; H05B 3/283
USPC .......................................... 438/107
See application file for complete search history.

(56) References Cited

U.S. PATENT DOCUMENTS

| | | | | |
|---|---|---|---|---|
| 6,585,471 B2 * | 7/2003 | Odajima | ........... | H01L 21/67144 156/701 |
| 6,588,109 B2 * | 7/2003 | Wilson | ................ | A01D 34/416 30/276 |
| 8,101,502 B2 | 1/2012 | Fukushima | | |
| 8,932,938 B2 | 1/2015 | Castex et al. | | |
| 9,095,980 B2 * | 8/2015 | Golda | .................... | H01L 24/75 |

(Continued)

FOREIGN PATENT DOCUMENTS

JP    5558073 B2    7/2014

OTHER PUBLICATIONS

WIPO: International Search Report and Written Opinion relating to WO application No. PCT/CA2022/050393, dated Jun. 16, 2022.

*Primary Examiner* — Vu A Vu
(74) *Attorney, Agent, or Firm* — Rowand LLP

(57) ABSTRACT

The present invention discloses a method and apparatus to correct surface non-uniformities between a donor substrate and a system substrate using a bonding tool. The bonding tool has multiple segments with internal structure to facilitate the objective. In particular, arc shaped guideways and resulting movements exemplify the method.

31 Claims, 5 Drawing Sheets

(56) References Cited

U.S. PATENT DOCUMENTS

| | | | |
|---|---|---|---|
| 9,391,042 B2 * | 7/2016 | Golda | H01L 24/75 |
| 9,406,640 B2 | 8/2016 | Seyama | |
| 9,566,687 B2 * | 2/2017 | Albrecht | B24B 37/30 |
| 11,600,515 B2 * | 3/2023 | Jeong | H01L 21/6732 |
| 2007/0014920 A1 * | 1/2007 | Syms | G03F 7/0002 |
| | | | 427/256 |
| 2016/0293566 A1 | 10/2016 | Golda et al. | |

* cited by examiner

GIMBAL BONDING TOOL AND A METHOD TO CORRECT SURFACE NON-UNIFORMITIES USING A BONDING TOOL

FIELD OF THE INVENTION

The present invention relates to the design of bonding tools and methods to correct surface non-uniformities between a donor substrate and a system substrate.

BRIEF SUMMARY

An embodiment of the invention relates to a bonding tool to correct surface non-uniformities between a donor substrate and a system substrate comprising, donor substrate mounted on a first plate, a second plate deformable under surface non-uniformity and a first housing plate holding the second plate.

Another embodiment of this invention relates to a method to correct surface non-uniformities using a bonding tool, the method comprising, having a tool head with four segments, having a first segment have flat surface to uniformly press a donor substrate against a device substrate, having the first segment fixed to a second segment, having the second segment and a third segment move relative to each other by means of a curved guideway, having the flat surface of the first segment to rotate and conform to irregularities in an angle of a device surface about a first axis due to the curved guideway, having the third segment and a fourth segment move relative to each other by means of a first part of the curved guideway, having the first part of the curved guideway have larger radius than a part of a lower curved guideway, and having the first part of the guideway oriented perpendicular to the part of the lower guideway, allowing for the flat surface of the first segment to rotate and conform to irregularities about a second axis which is perpendicular to that of the first axis.

BRIEF DESCRIPTION OF THE DRAWINGS

The foregoing and other advantages of the disclosure will become apparent upon reading the following detailed description and upon reference to the drawings.

Figure 1:
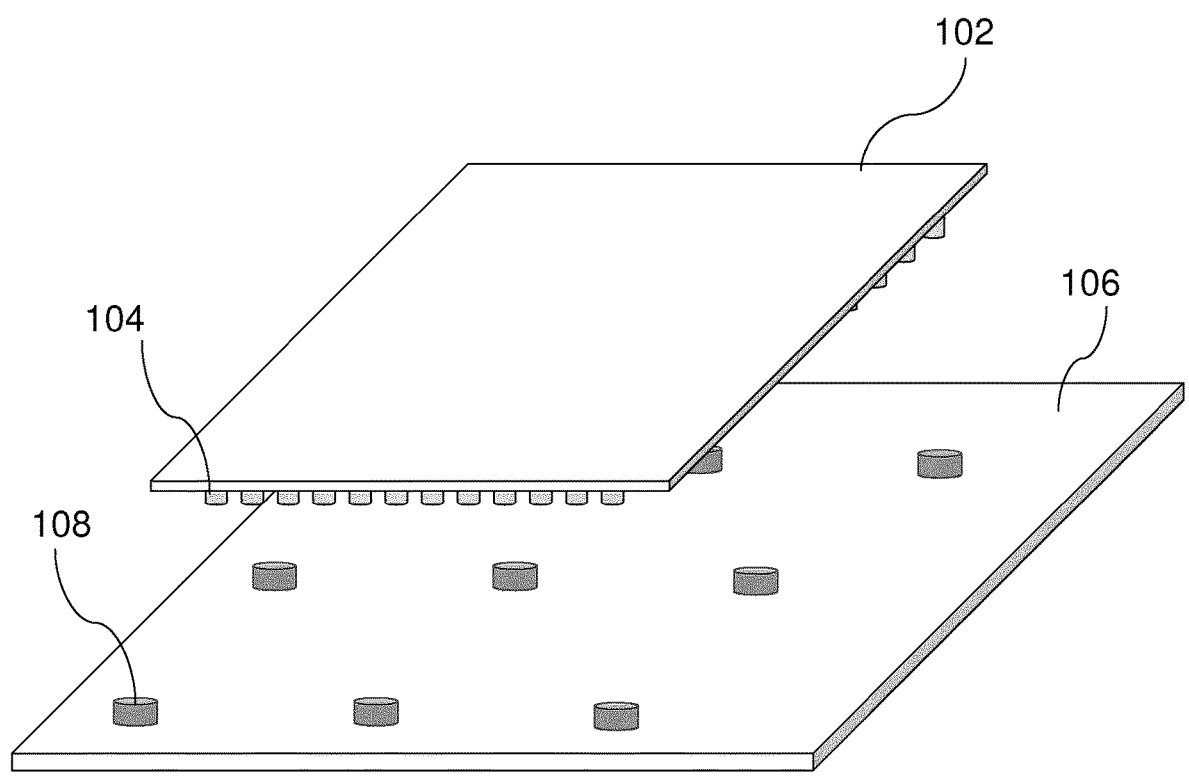
FIG. 1 shows a structure for transferring microdevices from a donor substrate to a system substrate.

While the present disclosure is susceptible to various modifications and alternative forms, specific embodiments or implementations have been shown by way of example in the drawings and will be described in detail herein. It should be understood, however, that the disclosure is not intended to be limited to the particular forms disclosed. Rather, the disclosure is to cover all modifications, equivalents, and alternatives falling within the spirit and scope of an invention as defined by the appended claims.

DETAILED DESCRIPTION

Die bonding in semiconductor die attach application requires the bond tool face to be parallel, or near parallel, to the target substrate in order to maintain a uniform pressure across the bonding area. In precision applications small angular irregularities can be present in the target substrate due to factors such as wafer bow or nonuniformities in the thermal expansion of the substrate.

The design seeks to provide a means to correct for angular irregularities on the target substrate without the use of external displacement sensors or actuators. The design allows the bond tool face to conform to the target substrate by means of arced crossed roller guideways. Two sets of arced guideways can be utilized to allow for rotation about two individual axes, namely the tip and tilt axis. The radii of the arced guideways can be selected to rotate about a common rotation center, which allows for the bond tool face to rotate about its central point. Crossed roller type bearings were selected due to their stiffness, rigidity, and their ability to withstand forces in all directions.

Hard stops can be used to restrict the angular degree of freedom. The design uses a set screw adjustable hard stop to limit the angle of each degree of freedom.

The design uses extension springs to return the bond tool face to a nominal position after the force application. Spring tension can be specified and/or adjusted to accommodate different bond tool face sizes.

For applications that require heating of the die, a ceramic heating element is implemented with an integrated thermocouple for controlling the temperature setpoint. Vacuum grooves are machined into the die attach face for die holding.

Two Arced Bearings

Two sets of arced bearings are used in order to provide rotation about two individual axes (tip & tilt axes). This method also restricts the rotation about the vertical axis, which allows for the rotational alignment of the bond tool face to be known with respect to the bond tool alignment apparatus after an initial calibration. This means that the rotation about the vertical axis does not need to be corrected after initial setup, and thus reduces the number of sensors used to actively align the donor substrate to the device substrate.

Alternative Parallelism Methods and Their Potential Shortfalls:

Measure the angle of the device substrate, and the angle of the donor substrate, and use actuators to correct the angle of the donor substrate to match that of the device substrate. Shortfalls: accumulation of errors from the measurement sensors used to detect the angle of each surface, combined with the errors in the actuators positioning capabilities may not meet requirements of alignment accuracy, or will be expensive to achieve such specification.

Ball in socket styled joint. This style of joint allows for free rotation about the tip, tilt, and vertical axes. It is simpler than the two axis joint proposed. Shortfalls: If the bond tool face is allowed to freely rotate about the vertical axis, the orientation of the tool face with respect to the bond tool alignment apparatus is no longer known.

In order to account for this unknown, an encoder or an external sensor must be used to measure the rotation angle, and then provide feedback to the alignment tool to provide correction. This increases the complexity of the tool head, as well as the cost of hardware required to accurately align the tool.

Additionally, ball and socket style joints require a "tendon" or some form of securing mechanism that holds the ball inside the socket. Current designs use a spring that secures the ball into the socket, which wear and require frequent adjustments to ensure the force required to secure the gimbal is constant over its lifetime. The two axis crossed roller bearing tool head proposed in this claim does not require any springs to secure the ends of the joint, since the bearings provide a rigid connection point.

FIG. 1 shows a structure for transferring microdevices 104 from a donor substrate 102 to a system substrate 106. There can be pads 108 located on the system substrate coupling to the microdevices after transfer. The process can include pressure, light, or heat applied to either of the substrates 102 or 106 to facilitate the transfer. To make sure intended microdevices from different areas of donor substrate 102 are transferred to the system substrate 106, the two substrates should be paralleled.

Figure 2A:
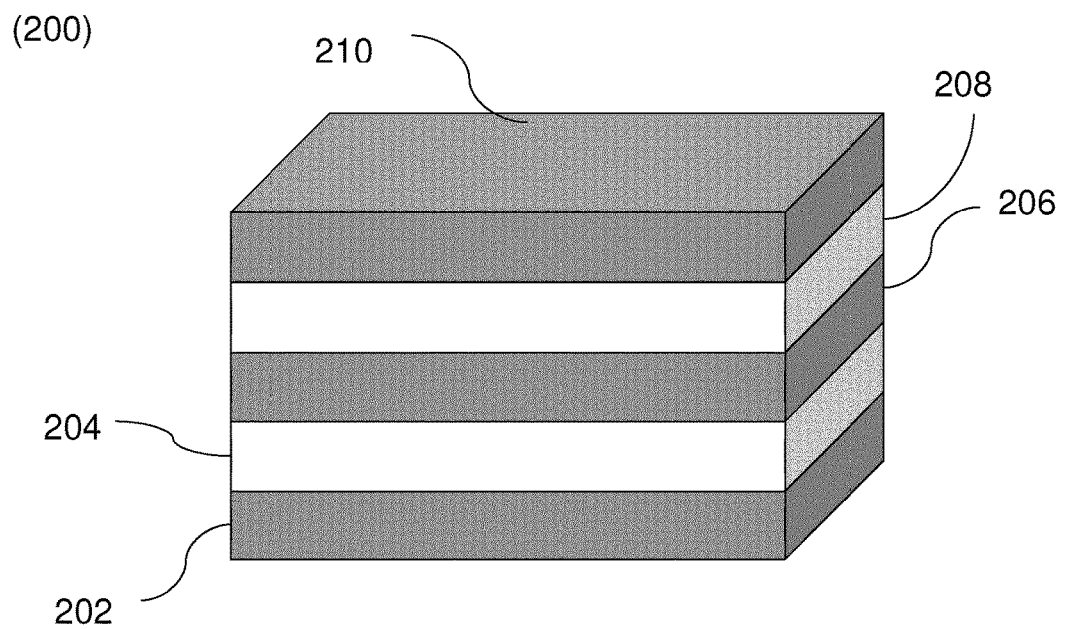
FIG. 2A shows an exemplary structure that forces the donor substrate to be paralleled to the system substrate.

FIG. 2A shows an exemplary structure that forces the donor substrate to be paralleled to the system substrate. Donor substrates can be mounted on plate 202. The plate 202 can include mounting mechanisms such as vacuum, magnetic or electrostatic force. The plate can also include heat elements or lighting elements assisting in the transfer. There can be at least one more plate 204 that can deform or move under nonuniform pressure. For one case, the structure 200 brought close to a system substrate while a donor substrate is on plate 202. Pressure applied to either the structure 200 or the system substrate. If the plate 202 is not fully parallel with the system substrate, the pressure will be distributed non uniformly on plate 204 and deforming the plate to compensate for the pressure and make the plate 202 and the system substrate parallel. In another case, the plate 204 is followed by a housing plate 206 and another deformation plate 208. The plate 208 and 206 can get deformed/moved in two perpendicular directions. Another housing plate 210 holds the plate 208.

In one method, plates 208 and 204 are polymers. In another related method, the plates 208 and 204 are mechanical structures that move under differential forces.

Figure 2B:
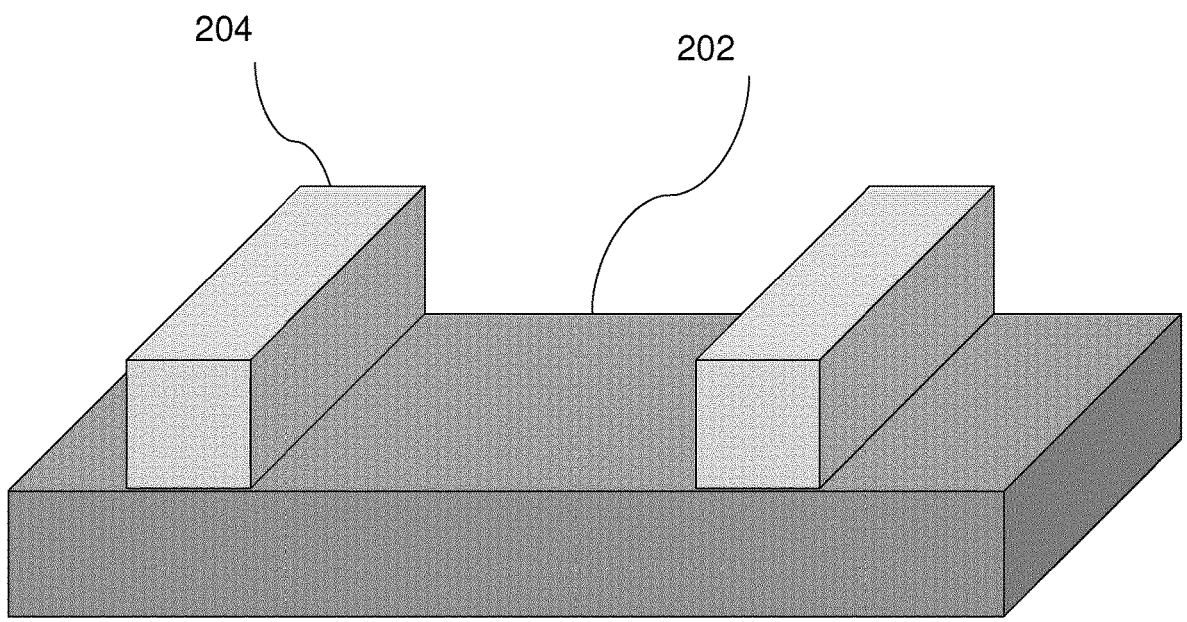
FIG. 2B shows another example whereby patterning the plate the movement/deformation in one direction is favored.

FIG. 2B shows another example whereby patterning the plate 204 (or 208) the movement/deformation in one direction is favored.

Figure 2C:
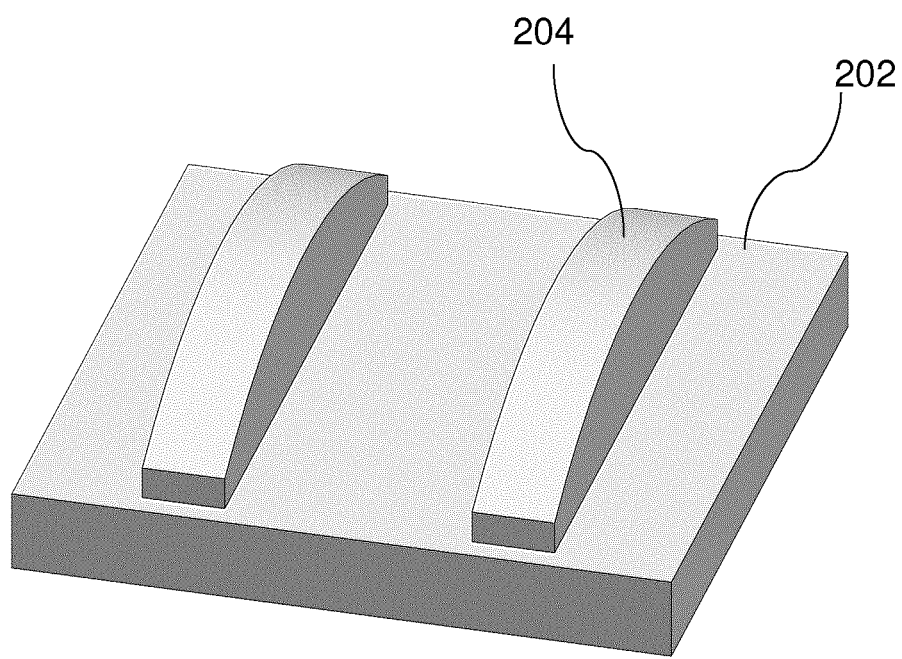
FIG. 2C shows another example that by shaping the plate the movement or deformation in one direction is favored.

FIG. 2C shows another example that by shaping the plate 204 (or 208) the movement or deformation in one direction is favored. Here the plate can move easier toward the direction of the arc. There can be opposite groves in housing plates 206 or 210 (FIG. 2A) to accommodate the movement. There can be some other layers between the housing and deformation plates to facilitate the movement or to control the displacement.

Figure 3A:
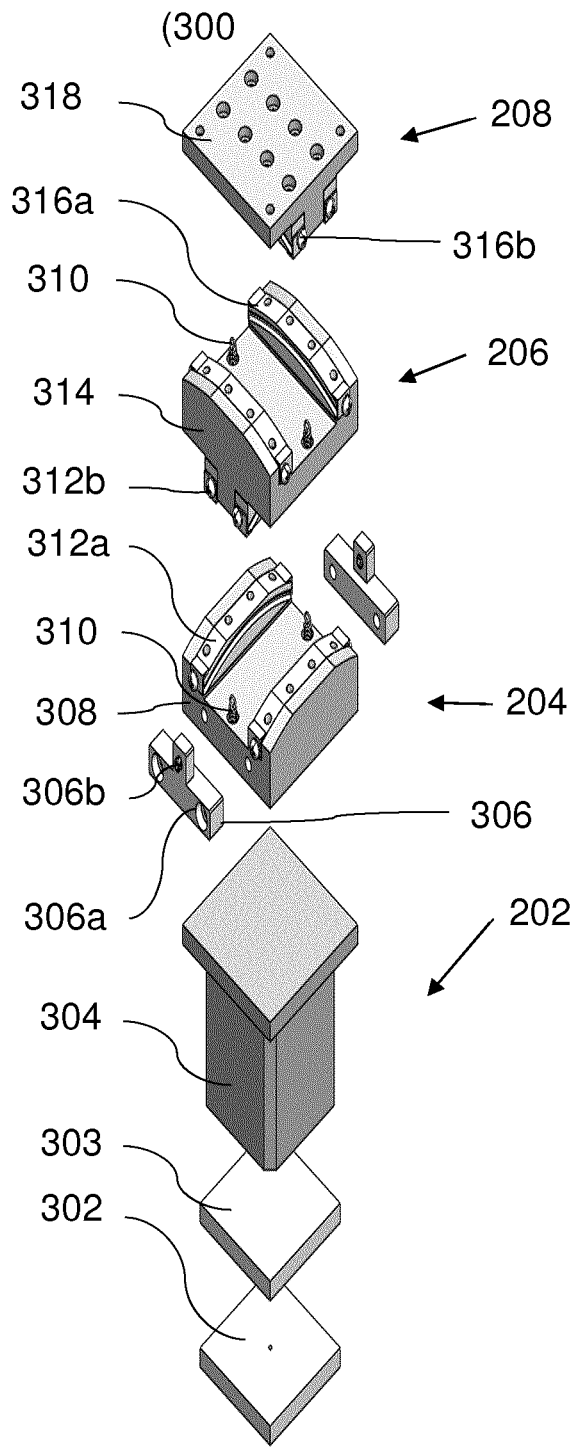
FIG. 3A shows an exemplary tool head to force the donor substrate and system substrate to be parallel.

FIG. 3A shows an exemplary tool head 300 to force the donor substrate and system substrate to be parallel. The tool head 300 can be segmented into four subsystems 202, 204, 206, and 208. Item 202 has a flat surface for uniformly pressing the donor substrate against the device substrate and is fixed to item 204. Items 204 and 206 have motion relative to each other by means of a curved guideway 312a. The guideway allows the flat surface of item 202 to rotate and conform to irregularities in the angle of the device surface about one axis. Items 206 and 208 have motion relative to each other by means of a curved guideway 316a which has a larger radius than the lower guideway 312a. The upper guideway 316a is oriented perpendicular to the lower guideway 312a, allowing for the flat surface of item 202 to rotate and conform to irregularities about a second axis which is perpendicular to that of the first rotational axis. The larger radius of the upper guideway 316a is selected such that the rotational axes of each curved guideway share an identical rotation point that acts as the center of rotation for the tool head. The rotation point of the two perpendicular rotational axes can be designated at a specific point, such as the center point of the tool head pressing face. The designated center of rotation can be adjusted with shims or by using an extruding/contracting positioning device.

In instances where the bonding face is perfectly parallel to the device plane, all points of the bonding face will contact the device substrate at the same instance in time and a uniform pressure will be applied. When there is an offset angle between the bond tool face and the device substrate, the first point of contact will occur at an off center point on the tool face. The force being applied at an offset distance from the tool center point creates a moment. In this instance a rigid bond tool does not conform to the device surface and would result in an uneven pressure distribution across the bonding area. The proposed tool head rotates as a result of the curved guideways when a moment is applied, thus maintaining a maximized contact area between the donor and device substrates.

The lower segment 202 includes components 302, 303, 304, and 308. Item 302 is a flat surface that can use vacuum, electrostatic, or other holding methods to secure the donor substrate to the tool head 300. Item 302 may also be a heating element since many applications require the donor substrate to be heated to a setpoint temperature in order to assist with the transfer to the device substrate. The heating mechanism can use a resistive heating element with an integrated thermocouple. The resistive heater can be constructed of a heating element that is sintered between two plates that can be composed of aluminum nitride (AlN) layers to form a homogeneous assembly.

To make sure the heat does not transfer substantially to the rest of the tool head 300 an insulative layer 303 can be added between the heating element 302 and the layer 304. Item 303 is an insulative layer used to minimize the amount of heat transferred from the ceramics resistive heating element (302) and the rest of the gimbal head structure. Minimizing the thermal expansion on the metal extension body (304) is important to hold dimensional tolerances for precision applications.

An extension body 304 that can be constructed from aluminum or other material is added to the tool head 300 to make sure the rotational center of the arced crossed roller guideways coincides with the center point of the ceramic resistive heating element. A secondary function of the extension body (304) is to act as a heat sink for surplus heat that transfers through the insulative layer (303).

The main body of segment 204 is the lower guide housing 308. The lower guide housing 308 is coupled to the extension 304 (if there is no extension it is coupled to the heating element (302) and provides a mounting location for the a-curved track (312a) of the lower guide assembly (312). The curved tack 312a and lower guide assembly 312 (comprising of 312a, 312b and 312c) form the first moving plate. The lower guide housing (308) can be constructed of aluminum or other material and has a precisely ground mounting surface to seat the a-curved track (312a) of the lower guide assembly (312).

To limit the movement of the moving plate (312a and 312), the angle limiter 306 can be added to the structure. The angle limiter 306 serves as a hard stop which restricts the range of motion between the lower guide housing (308) and the intermediate guide housing (314). The angle limiter (306) consists of a housing (306a), and a set screw (306b) which allows for adjustment of the total range of motion. The housing 306a can be fabricated from aluminum or other materials.

An extension spring 310 enables the bonding tool head to return to a nominal position after the force application. A pair of extension springs are installed with connections to the lower guide housing (308) and the intermediate guide housing (314). The spring can be also added to the outside walls of 308 and 314. The springs connections are located an equal distance from the central plane of the lower guide housing (308) and the intermediate guide housing (314) in order to balance the moment exerted by the tensile force of the pair of extension springs (310) at the nominal position.

The main body of section 206 is the intermediate guide housing 314. The intermediate guide housing (314) provides a mounting location for the b-curved track of the lower guide (312b) and the a-curved track of the upper guide (316a). The guideways attached to the intermediate guide housing 314 allows for the relative rotation of sections 204, 206, and 208. The intermediate guide housing is constructed of aluminum and has precisely machined mounting surfaces for the b-curved track of the lower guide (312b) and the a-curved track of the upper guides (316a). Section 206 has mounting locations for extension springs that can be used to return section 206 to a nominal angle after release of the applied force. A set of angle limiters 306 can be added to section 206 in a similar fashion to section 204 with attachment points located on the lower guide housing 308.

The main body of section 208 is the upper guide housing 318. The upper guide housing (318) provides a mounting location for the b-curved track (316b) of the upper guide 316 (316a and 316b). The upper guide housing (318) provides an attachment point for the gimbal tool head to the die bonder tool positioning stages or support structure. The guide attached to the upper housing allows for rotation between sections 206 and 208. The upper guide housing 318 is constructed of aluminum and has precisely machined mounting surfaces to seat the b-curved track (316b) of the upper guide (316).

Figure 3B:
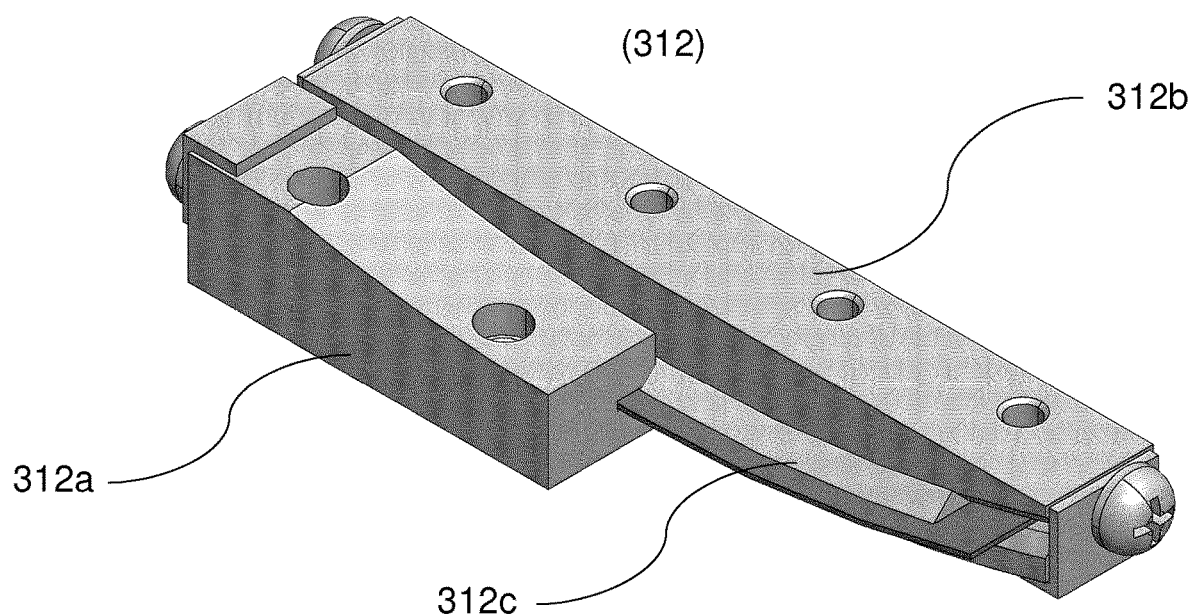
FIG. 3B shows a sectional view of the lower guides.

FIG. 3B shows a sectional view of the lower guides 312. The lower guides (312) are an arced crossed roller style bearing that are used to provide low friction rotational motion about a fixed point. The lower guideway consists of three components, the a-curved track (312a), b-curved track (312b), and a curved roller cage (312c). The a-curved (312a) and b-curved tracks (312b) have precisely machined v-grooves that allow the curved roller cage (312c) to act as a rolling element between the a-curved track (312a) and b-curved track (312b). The rotation point of the lower guides (312) is governed by the radius of curvature of the a-curved and b-curved tracks (312a, 312b). The cylindrical rollers or the curved roller cage (312c) provide a large contact area which increases the rigidity of the guideway.

Method Aspects

The present invention relates to a method to correct surface non-uniformities using a bonding tool, the method comprising, having a tool head with four segments, having a first segment have flat surface to uniformly press a donor substrate against a device substrate, having the first segment fixed to a second segment, having the second segment and a third segment move relative to each other by means of a curved guideway, having the flat surface of the first segment to rotate and conform to irregularities in an angle of a device surface about a first axis due to the curved guideway, having the third segment and a fourth segment move relative to each other by means of a first part of the curved guideway, having the first part of the curved guideway have larger radius than a part of a lower curved guideway, and having the first part of the guideway oriented perpendicular to the part of the lower guideway, allowing for the flat surface of the first segment to rotate and conform to irregularities about a second axis which is perpendicular to that of the first axis.

The method further comprises wherein the larger radius of the first part of the curved guideway is selected such that the rotational axes of each curved guideway share an identical rotation point that acts as a center of rotation for the tool head. Further, a rotation point of the two perpendicular rotational axes is designated at a specific point, such as a center point of a tool head pressing face. In addition, a designated center of rotation is adjusted with shims or by using an extruding or contracting positioning device.

The method further comprises with the first segment having four components comprising, a flat surface that is a heating element or uses a vacuum, electrostatic, or other holding methods to secure the donor substrate to the tool head, an insulative layer added between the heating element and an extension body that is constructed from aluminum or other material added to the tool head to enable the rotational center of arced crossed roller guideways coincides with the center point of a ceramic resistive heating element, and a lower guide housing. Here a heating mechanism of the heating element uses a resistive heating element with an integrated thermocouple. Further, the resistive heating element is constructed of a heating element that is sintered between two plates that are composed of aluminum nitride (AlN) layers to form a homogeneous assembly. In addition, the insulative layer may minimize an amount of heat transferred from the heating element and the rest of the tool head, and the extension body acts as a heat sink for surplus heat that transfers through the insulative layer.

The method further comprises a main body of the second segment of the lower guide housing is coupled to the extension body and provides a mounting location for an a-curved track of a lower guide assembly. Here, the curved track of the lower guide assembly forms a first moving plate. Further, the lower guide housing is made of aluminum or other materials and has a precisely ground mounting surface to seat the a-curved track of the lower guide assembly and an angle limiter is added limiting the movement of the first moving plate and serving as a hard stop to restrict a range of motion between the lower guide housing and an intermediate guide housing, wherein the angle limiter consists of a housing, and a set screw to allow for adjustment of the range of motion and the angle limiter housing may be fabricated from aluminum. In addition, an extension spring enables the bonding tool head to return to a nominal position after a force application and a pair of extension springs are installed with connections to the lower guide housing and the intermediate guide housing, wherein the springs connections are located an equal distance from a central plane of the lower guide housing and the intermediate guide housing balancing a moment exerted by a tensile force of the pair of extension springs at the nominal position and wherein the extension springs are also added to the outside walls of the lower guide housing and the intermediate guide housing.

Continuing, the method further comprises, a main body of the third segment is the intermediate guide housing providing a mounting location for the b-curved track of the lower guide and the a-curved track of the upper guide, wherein the guideways attached to the intermediate guide housing allow a relative rotation of segments second, third and fourth and wherein the intermediate guide housing is made of aluminum and has precisely machined mounting surfaces for the b-curved track of the lower guide and the a-curved track of the upper guides. Further, the third segment has mounting locations for the extension springs that enables return of the third segment to a nominal angle after release of the applied force, wherein a set of angle limiters are added to the third segment as they are added to the second segment with attachment points located on the lower guide housing. Here, a main body of the fourth segment is an upper guide housing providing a mounting location for the b-curved track of the upper guide, wherein the upper guide housing provides an attachment point for the tool head to die bonder tool positioning stages. Here, the guide attached to the upper housing allows rotation between the third and fourth segments and the upper guide housing is made of aluminum and has precisely machined mounting surfaces to seat the b-curved track of the upper guide as well, wherein the lower guides are an arced crossed roller style bearing providing low friction rotational motion about a fixed point and have three components, the a-curved track, b-curved track, and a curved roller cage. Here, the a-curved and b-curved tracks have precisely machined v-grooves that allow the curved roller cage to act as a rolling element between the a-curved track and b-curved track and wherein the rotation point of the lower guides is governed by a radius of curvature of the a-curved and b-curved tracks as well wherein the cylindrical rollers or the curved roller cage provide a large contact area which increases a rigidity of the guideway.

While particular embodiments and applications of the present invention have been illustrated and described, it is to be understood that the invention is not limited to the precise construction and compositions disclosed herein and that various modifications, changes, and variations can be apparent from the foregoing descriptions without departing from the spirit and scope of the invention as defined in the appended claims.

The invention claimed is:

1. A method to correct surface non-uniformities using a bonding tool, the method comprising:
having a tool head with four segments;
having a first segment have flat surface to uniformly press a donor substrate against a device substrate;
having the first segment fixed to a second segment;
having the second segment and a third segment move relative to each other by means of a curved guideway;
having the flat surface of the first segment to rotate and conform to irregularities in an angle of a device surface about a first axis due to the curved guideway;
having the third segment and a fourth segment move relative to each other by means of a first part of the curved guideway;
having the first part of the curved guideway have larger radius than a part of a lower curved guideway; and
having the first part of the guideway oriented perpendicular to the part of the lower guideway, allowing for the flat surface of the first segment to rotate and conform to irregularities about a second axis which is perpendicular to that of the first axis.

2. The method of claim 1, wherein the larger radius of the first part of the curved guideway is selected such that the rotational axes of each curved guideway share an identical rotation point that acts as a center of rotation for the tool head.

3. The method of claim 2, wherein a rotation point of the two perpendicular rotational axes is designated at a specific point, wherein the specific point is a center point of a tool head pressing face.

4. The method of claim 3, wherein a designated center of rotation is adjusted with shims or by using an extruding or contracting positioning device.

5. The method of claim 1, wherein the first segment has four components comprising:

a flat surface that is a heating element or uses a vacuum, electrostatic, or other holding methods to secure the donor substrate to the tool head;
an insulative layer added between the heating element and an extension body that is constructed from aluminum or other material added to the tool head to enable the rotational center of arced crossed roller guideways coincides with the center point of a ceramic resistive heating element; and
a lower guide housing.

6. The method of claim 5, wherein a heating mechanism of the heating element uses a resistive heating element with an integrated thermocouple.

7. The method of claim 6, wherein the resistive heating element is constructed of a heating element that is sintered between two plates that are composed of aluminum nitride (AlN) layers to form a homogeneous assembly.

8. The method of claim 5, wherein the insulative layer minimizes an amount of heat transferred from the heating element and a rest of the tool head.

9. The method of claim 5, wherein the extension body acts as a heat sink for surplus heat that transfers through the insulative layer.

10. The method of claim 5, wherein a main body of the second segment the lower guide housing that is coupled to the extension body and provides a mounting location for an a-curved track of a lower guide assembly.

11. The method of claim 10, wherein the curved track the lower guide assembly forms a first moving plate.

12. The method of claim 11, wherein a lower guide housing is made of aluminum or other materials and has a precisely ground mounting surface to seat the a-curved track of the lower guide assembly.

13. The method of claim 11, wherein an angle limiter is added limiting the movement of the first moving plate and serving as a hard stop to restrict a range of motion between the lower guide housing and an intermediate guide housing.

14. The method of claim 13, wherein the angle limiter consists of a housing, and a set screw to allow for adjustment of the range of motion.

15. The method of claim 14, wherein the angle limiter housing is fabricated from aluminum.

16. The method of claim 13, wherein an extension spring enables the bonding tool head to return to a nominal position after a force application and a pair of extension springs are installed with connections to the lower guide housing and the intermediate guide housing.

17. The method of claim 16, wherein the springs connections are located an equal distance from a central plane of the lower guide housing and the intermediate guide housing balancing a moment exerted by a tensile force of the pair of extension springs at the nominal position.

18. The method of claim 16, wherein the extension springs are also added to the outside walls of the lower guide housing and the intermediate guide housing.

19. The method of claim 17, wherein a main body of the third segment is the intermediate guide housing providing a mounting location for the b-curved track of the lower guide and the a-curved track of the upper guide.

20. The method of claim 19, wherein the guideways attached to the intermediate guide housing allow a relative rotation of segments second, third and fourth.

21. The method of claim 20, wherein the intermediate guide housing is made aluminum and has a precisely machined mounting surfaces for the b-curved track of the lower guide and the a-curved track of the upper guides.

22. The method of claim 21, wherein the third segment has mounting locations for the extension springs that enable return the third segment to a nominal angle after release of the applied force.

23. The method of claim 22, wherein a set of angle limiters are added to the third segment as they are added to the second segment with attachment points located on the lower guide housing.

24. The method of claim 22, wherein a main body of the fourth segment is an upper guide housing providing a mounting location for the b-curved track of the upper guide.

25. The method of claim 24, wherein the upper guide housing provides an attachment point for the tool head to die bonder tool positioning stages.

26. The method of claim 25, wherein the guide attached to the upper housing allows rotation between the third and fourth segments.

27. The method of claim 26, wherein the upper guide housing is made of aluminum and has precisely machined mounting surfaces to seat the b-curved track of the upper guide.

28. The method of claim 27, wherein the lower guides are an arced crossed roller style bearing providing low friction rotational motion about a fixed point and have three components, the a-curved track, b-curved track, and a curved roller cage.

29. The method of claim 28, wherein the a-curved and b-curved tracks have precisely machined v-grooves that allow the curved roller cage to act as a rolling element between the a-curved track and b-curved track.

30. The method of claim 29, wherein the rotation point of the lower guides is governed by a radius of curvature of the a-curved and b-curved tracks.

31. The method of claim 29, wherein cylindrical rollers or the curved roller cage provide a large contact area which increases a rigidity of the guideway.

\* \* \* \* \*